United States Patent
Straeussnigg et al.

(12) 
(10) Patent No.: US 12,325,627 B2
(45) Date of Patent: *Jun. 10, 2025

(54) CONFIGURABLE MICROPHONE USING INTERNAL CLOCK CHANGING

(71) Applicant: Infineon Technologies AG, Neubiberg (DE)

(72) Inventors: Dietmar Straeussnigg, Villach (AT); Daniel Neumaier, Feldkirchen (AT)

(73) Assignee: Infineon Technologies AG, Neubiberg (DE)

( * ) Notice: Subject to any disclaimer, the term of this patent is extended or adjusted under 35 U.S.C. 154(b) by 157 days.

This patent is subject to a terminal disclaimer.

(21) Appl. No.: 16/773,079

(22) Filed: Jan. 27, 2020

(65) Prior Publication Data

US 2021/0229980 A1    Jul. 29, 2021

(51) Int. Cl.
*B81B 7/00* (2006.01)
*H03M 3/00* (2006.01)
*H04R 19/04* (2006.01)

(52) U.S. Cl.
CPC .............. *B81B 7/008* (2013.01); *H03M 3/47* (2013.01); *H03M 3/496* (2013.01); *H04R 19/04* (2013.01); *H04R 2201/003* (2013.01)

(58) Field of Classification Search
CPC .............. H04R 19/04; H04R 19/005; H04R 2201/003; H03M 3/47; H03M 3/496; B81B 7/008
USPC .................................................. 257/438, 414
See application file for complete search history.

(56) References Cited

U.S. PATENT DOCUMENTS

| | | | |
|---|---|---|---|
| 6,243,597 B1* | 6/2001 | Daanen | H04W 52/029 455/256 |
| 7,453,382 B2* | 11/2008 | Wiesbauer | H03M 3/484 341/143 |
| 9,542,933 B2* | 1/2017 | Mortensen | G10L 15/10 |
| 10,297,258 B2 | 5/2019 | Lesso et al. | |
| 10,348,326 B2 | 7/2019 | Bach et al. | |
| 10,595,133 B2* | 3/2020 | Straeussnigg | H04R 19/04 |
| 11,115,041 B1* | 9/2021 | Witte | H03M 3/02 |
| 2008/0165043 A1* | 7/2008 | Wiesbauer | H03M 3/484 341/143 |
| 2011/0057826 A1 | 3/2011 | Peng et al. | |
| 2014/0257813 A1* | 9/2014 | Mortensen | G10L 15/02 704/251 |
| 2015/0236595 A1* | 8/2015 | Babazadeh | H02M 3/157 323/272 |

(Continued)

FOREIGN PATENT DOCUMENTS

| | | |
|---|---|---|
| CN | 107770708 A | 3/2018 |
| KR | 20190045076 A | 5/2019 |

*Primary Examiner* — Hrayr A Sayadian
(74) *Attorney, Agent, or Firm* — Slater Matsil, LLP

(57) ABSTRACT

A method of operating a microelectromechanical system (MEMS) includes, in a first operational mode, converting an analog output of the MEMS into a first internal data stream and a first external data stream having a first sampling rate; transitioning from the first operational mode to a second operation mode without restarting the MEMS; and in the second operational mode, converting the analog output of the MEMS into a second internal data stream having a second sampling rate different from the first sampling rate, and performing a sampling rate conversion of the second internal data stream to generate a second external data stream.

20 Claims, 8 Drawing Sheets

(56) References Cited

U.S. PATENT DOCUMENTS

| | | |
|---|---|---|
| 2016/0050024 A1* | 2/2016 | Kaneda .............. H04B 10/2575 |
| | | 398/208 |
| 2016/0241961 A1 | 8/2016 | Josefsson |
| 2017/0017258 A1 | 1/2017 | Park et al. |
| 2018/0005636 A1 | 1/2018 | Lesso et al. |
| 2018/0014124 A1* | 1/2018 | Straeussnigg ........ H03G 3/3005 |
| 2019/0289404 A1 | 9/2019 | Straeussnigg et al. |
| 2021/0235200 A1* | 7/2021 | Straeussnigg ............ H04R 3/00 |

* cited by examiner

CONFIGURABLE MICROPHONE USING INTERNAL CLOCK CHANGING

TECHNICAL FIELD

The present invention relates generally to a system and method for a configurable microphone using internal clock changing.

BACKGROUND

The application of MEMS (microelectro-mechanical systems) technology to microphones has led to the development of small microphones with high performance. MEMS microphones offer high SNR (signal-to-noise ratio), low power consumption, good sensitivity, and are available in small packages that are compatible with surface mount assembly processes.

MEMS microphones use acoustic sensors that are fabricated on semiconductor production lines using silicon wafers. Layers of different materials are deposited on top of a silicon wafer and the unwanted material is then etched away, creating a moveable membrane and a fixed backplate over a cavity in the base wafer. The sensor backplate may be a stiff perforated structure that allows air to move easily through it, while the membrane is a thin solid structure that flexes in response to the change in air pressure caused by sound waves. Changes in air pressure created by sound waves cause the thin membrane to flex while the thicker backplate remains stationary as the air moves through its perforations. The movement of the membrane creates a change in the amount of capacitance between the membrane and the backplate, which is translated into an electrical signal by an ASIC (Application Specific Integrated Circuit). The ASIC measures the voltage variations caused when the capacitance between the membrane and the fixed backplate changes due to the motion of the membrane in response to sound waves. In many applications, a low noise audio Analog to Digital Converter (ADC) is needed to convert the output of analog microphones into digital format for processing and/or transmission. The ADC can be clocked at various frequencies in a tradeoff between microphone performance and microphone power consumption.

SUMMARY

According to an embodiment, a method of operating a microelectromechanical system (MEMS) comprises, in a first operational mode, converting an analog output of the MEMS into a first internal data stream and a first external data stream having a first sampling rate; transitioning from the first operational mode to a second operation mode without restarting the MEMS; and in the second operational mode, converting the analog output of the MEMS into a second internal data stream having a second sampling rate different from the first sampling rate, and performing a sampling rate conversion of the second internal data stream to generate a second external data stream.

According to another embodiment, a circuit comprises a clock divider having an input coupled to a clock signal input; a multiplexer having a first input coupled to an output of the clock divider, a second input coupled to the clock signal input, a third input coupled to a control signal input, and an output, wherein the multiplexer couples the first input to the output or couples the second input to the output according to a state of the control signal input; a signal processing circuit having an analog signal input, a clock signal input coupled to the output of the multiplexer, and a digital signal output comprising one or more output nodes; and a frequency converter coupled between the digital signal output of the signal processing circuit and a data stream output, wherein a conversion factor of the frequency converter is determined according to the state of the control signal input.

According to another embodiment, a microelectromechanical (MEMS) circuit in a single package comprises a control signal input, a clock signal input, and a data stream output for providing a constant rate single bit output stream at one or more output nodes; a MEMS device; and a signal processing circuit coupled to the MEMS device, to the control signal input, to the clock signal input, and the data stream output, wherein, in a first mode of operation determined by a first state of the control signal input, at least a portion of the signal processing circuit is directly coupled to the clock signal input, and wherein, in a second mode of operation determined by a second state of the control signal input, the at least a portion of the signal processing circuit is coupled to the clock signal input through a clock divider.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

In standard digital microphones the adjustment of or switching between microphone performance and microphone power consumption is handled by selecting different operating modes, which in turn is typically controlled by selecting different clock rates only. For example, a low power operating mode of the digital microphone may having a corresponding sampling frequency of $f_s$=768 kHz, whereas a high performance operating mode of the digital microphone may have a corresponding sampling frequency of $f_s$=3.072 MHz. Other frequencies for the high performance operating mode can be used such as 2.4 MHz or 1.536 MHz, in embodiments. If an operating mode change is required, for example a change from a low power mode to a high performance mode, the digital microphone clock is changed from 768 kHz to 3.072 MHz. To perform the mode change in the digital microphone the (changed) clock is detected (typically using a power mode detector (PMD)). In existing digital microphones the mode change is typically handled as a startup (or restart) of the digital microphone for safety reasons. During a mode change the acoustic signal is not available, which can also cause switching artefacts. Typically, the operating mode change can take between 1 ms and 10 ms, measured between the end of a first operating mode to the beginning of a second operating mode.

An advantage of some embodiments includes the ability to seamlessly adjust between operating modes without restart delay and with minimal switching artefacts (for example during seamless dynamic SNR adjustment or during seamless dynamic power saving strategies). Embodiments of a digital microphone and method of operating a digital microphone are therefore described below wherein an adjustment or switching between a low power mode and a high performance operating mode occurs seamlessly without any restart delay and with a minimum of switching artefacts. In an embodiment, only one additional external control signal input to the digital microphone is required, and the clock rate or sampling rate of an output signal at one or more output nodes of the digital microphone is configured to be constant between the two operating modes.

In an embodiment, when an external control signal (ctrl) is available, the performance (SNR) and/or power consumption of a digital microphone can be flexibly and seamlessly changed, by deriving different internal clock rates with a clock divider block responsive to the external control signal (ctrl) from a constant incoming clock (clk) as will be described in further detail below. According to an embodiment, a constant output signal clock rate can be provided by an adjustable interpolation stage that is also responsive to the external control signal (ctrl) that is also described in further detail below.

Figure 1A:
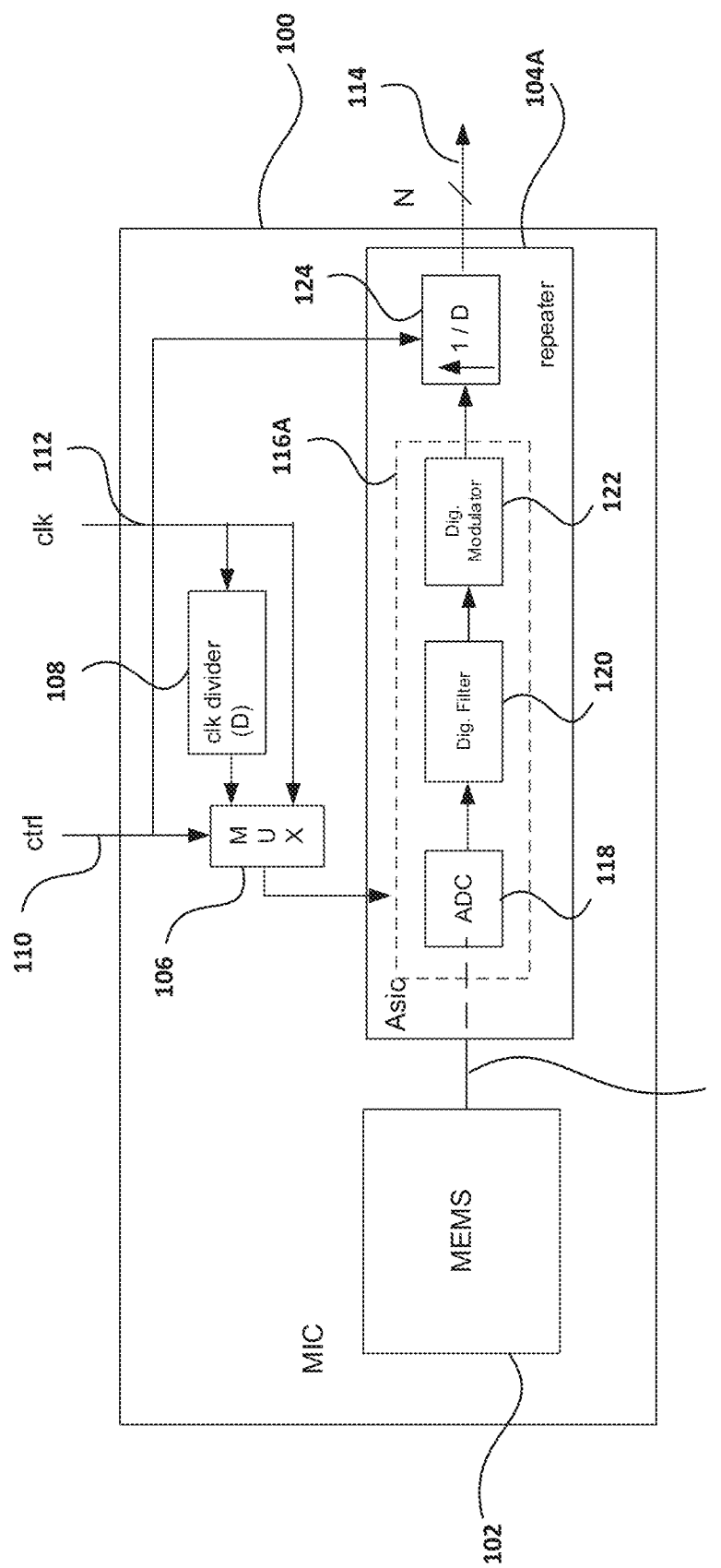
FIG. 1A shows a digital microphone with internal clock changing, according to an embodiment.

FIG. 1A shows a digital microphone 100 with internal clock changing, according to an embodiment. Digital microphone 100 is typically provided in a ported ceramic or plastic package and includes a MEMS microphone sensor 102 and an ASIC 104A coupled to MEMS microphone sensor 102. ASIC 104A receives an analog signal 103 from MEMS microphone sensor 102 and provides a digital output 114 corresponding to the analog signal 103 having "N" nodes or bits, wherein N is an integer between 1 and 8, in an embodiment. In another embodiment, N can be an integer greater than eight. In an embodiment, digital microphone 100 includes a control input 110 for receiving the control input signal (ctrl) and a clock input 112 for receiving the clock input signal (clk). In an embodiment, a multiplexer 106 is coupled between the control input 110 and the ASIC 104A, and a clock divider 108 is coupled between the clock input 112 and the multiplexer 106. The control input 110 is also coupled to the ASIC 104A. The operation of the ASIC 104A, multiplexer 106, and clock divider 108 with respect to the clk and ctrl signals is described in further detail below.

ASIC 104A includes a signal processing circuit 116A coupled to a repeater 124. The input signal of the signal processing circuit is the analog signal 103 of ASIC 104A, and the output of repeater 124 is the digital output 114 of ASIC 104A. In FIG. 1A, signal processing circuit 116A includes an ADC 118 that can comprise a sigma-delta ADC, in an embodiment. The ADC 118 converts the analog signal 103 received from the MEMS microphone sensor 102 into a data stream comprising one or more bit streams at one or more nodes. In an embodiment, a digital filter 120 can comprise a loop filter and is used for further processing the digital output of ADC 118. For example, digital filter 120 can be used for removing quantization noise outside of the pass band of the filter. A digital modulator 122 is used for noise-shaping of the filtered digital output from digital filter 120. The output of digital modulator 122 forms the output of signal processing circuit 116A in the example of FIG. 1A. Finally, the output of signal processing circuit 116A is coupled to repeater 124, which in the example of FIG. 1A is not part of the signal processing circuit 116A. In the example of FIG. 1A, the output of multiplexer 106 provides the clock signal for the signal processing circuit 116A, notably the ADC 118, and repeater 124 is coupled directly to control input 110 for directly receiving the control signal, ctrl.

Multiplexer 106 has three inputs, and an output. A first input receives the ctrl signal at control input 110. A second input receives a divided version of the clk signal through clock divider 108, and a third input received an undivided version of the clk signal directly from clock input 112. The logic state of the ctrl signal thus controls whether or not the divided or undivided clock signal is transferred through multiplexer 106 to the multiplexer output.

Clock divider 108 is a divider circuit that divides the input clock signal by a factor (D). For example, in the low power operating mode, clock divider 108 can divide the clock signal by two (D=2), by four (D=4) or other any other factor.

To obtain flexibility in terms of performance (SNR) and/or power consumption, different clock rates generated by the clock divider 108 and multiplexer 106 from the constant incoming clock rate (clk) can be used by signal processing circuit 116A. In the case of a reduced internal clock rate (clkred=clk/D). The clock rate of the output data stream at digital output 114 can be made constant by repeater 124. In the simplest implementation, repeater 124 can be a repeater interpolating (repeating values) at a factor D. In the high performance operating mode, the undivided clock signal is provided to signal processing circuit 116A. Thus, the sampling rate for the ADC is the same as the clock frequency of the input clock signal, clk at clock input 112. The state of the control signal configures repeater 124 to not add any additional zeroes to the output of the digital signal received from signal processing circuit 116A. In the low power operating mode, the divided clock signal is provided to signal processing circuit 116A. Thus, the sampling rate for the ADC is equal to the clock frequency of the input clock signal divided by D. The state of the control signal configures repeater 124 to add an appropriate number of zeroes to the output of the digital signal received from signal processing circuit 116A, such that the clock rate of the digital signals provided in the high performance operating mode and the low power operating mode are the same.

A further advantage of the digital microphone embodiment shown in FIG. 1A is that there is no interruption of the audio signal (compared to up to 10 ms in an existing solution). The solution provided by the embodiment of FIG. 1A enables the possibility to minimize switching artefacts (or transients) if the internal clock rate is changed (e.g. by selecting zero crossings of the audio signal, and adapting filter coefficients to new selected internal clock rate as is described in further detail below.)

In addition, the digital microphone embodiment of FIG. 1A allows an embodiment without an input clock related to power mode switching. In such a configuration, all power mode detection related blocks in the digital microphone can be removed, which minimizes design complexity, silicon die area and power dissipation.

FIG. 1A thus shows an embodiment wherein ASIC 104A is clocked at the derived clock rate defined by the control signal ctrl. At the digital output 114, the single bit or N bit digital output signal is again interpolated up to the input clock rate when required, for example in the low power mode.

Figure 1B:
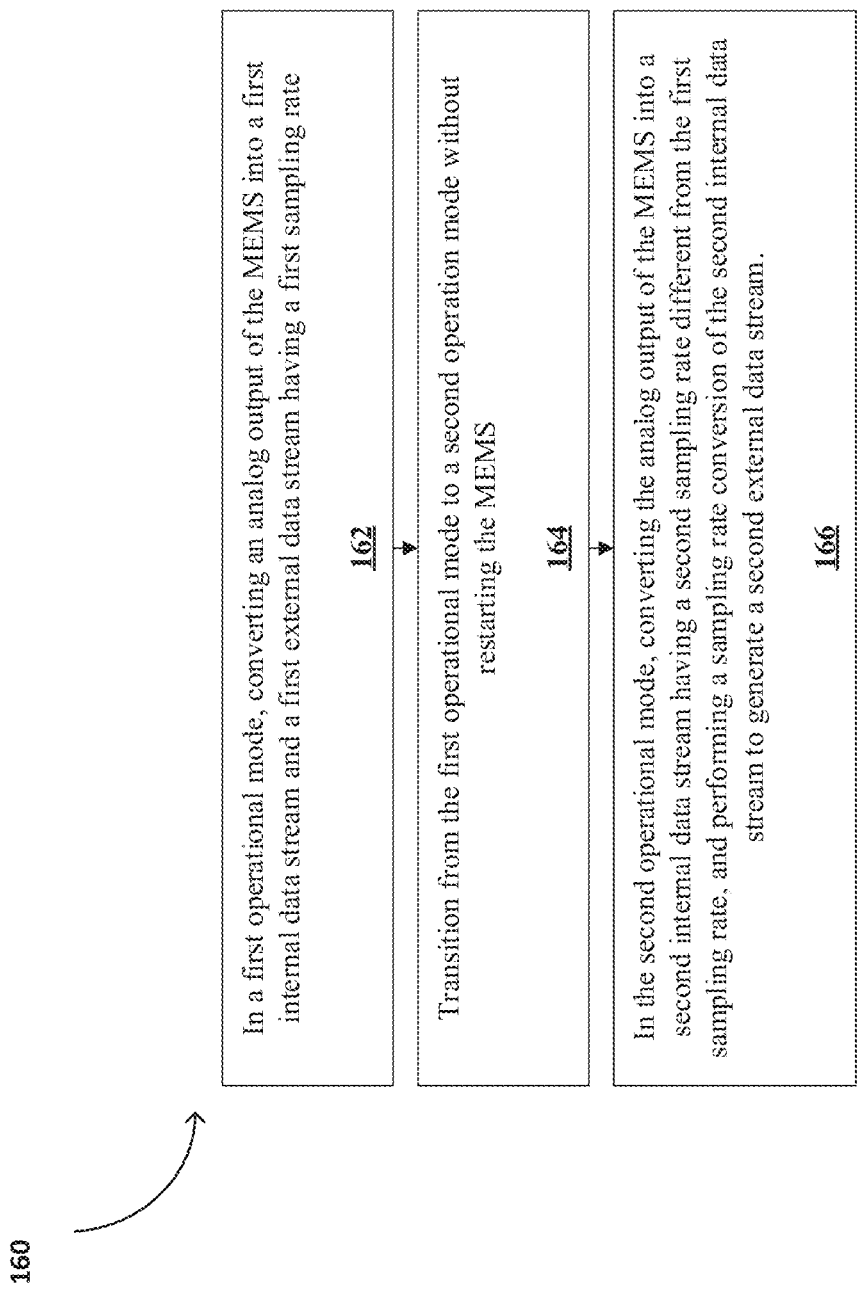
FIG. 1B shows a flow chart of a method of operating a digital microphone with internal clock changing, according to an embodiment.

FIG. 1B illustrates a method 160 of operating a micro-electromechanical system (MEMS) that includes, in a first operational mode (for example a high performance operating mode), converting an analog signal 103 of the MEMS microphone sensor 102 into a first internal data stream (at output of ADC 118) and a first external data stream (at digital output 114) having a first sampling rate (derived from the undivided clock frequency), which is step 162. Transitioning from the first operational mode to a second operation mode (for example a low power mode) without restarting the MEMS, which is step 164. And, in the second operational mode, converting the analog signal 103 of the MEMS microphone sensor 102 into a second internal data stream (at output of ADC 118) having a second sampling rate (derived from the divided clock frequency) different from the first sampling rate, and performing a sampling rate conversion (using repeater 124 to add the appropriate number of zeroes) of the second internal data stream to generate a second external data stream (at digital output 114), which is step 166.

Figure 2:
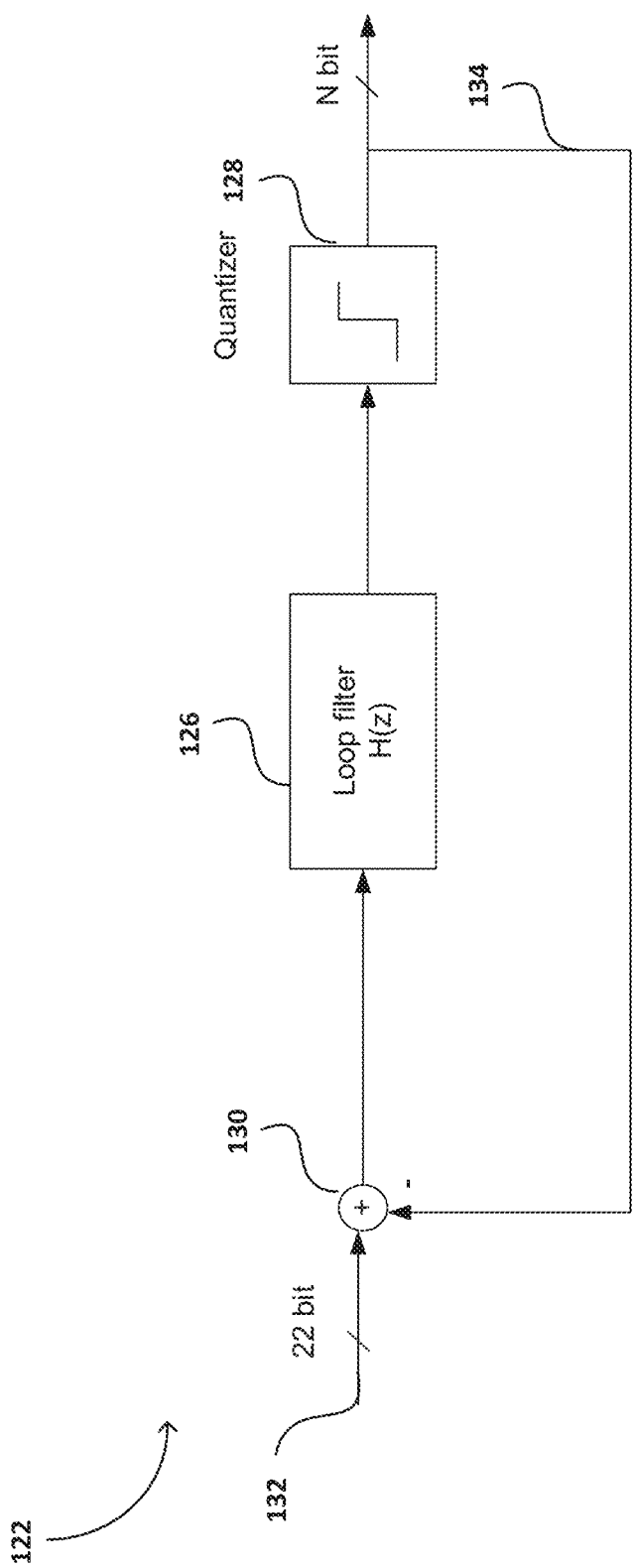
FIG. 2 shows a modulator for the embodiment of FIG. 1A, according to an embodiment.

FIG. 2 shows a digital modulator 122 for the digital microphone embodiment of FIG. 1A. In an embodiment, digital modulator 122 includes an input 132 that is coupled to digital filter 120, shown in FIG. 1A. In an embodiment, input 132 receives a 22 bit data stream on a digital bus from digital filter 120. In other embodiments, other sized data streams can be received from digital filter 120. Input 132 is coupled to an input of summer 130, whose output is coupled to loop filter 126. Loop filter 126 has a transfer function labeled H(z), and in an embodiment can comprise a low-pass filter. The output of loop filter 126 is coupled to a quantizer 128 providing a stair-step function and providing an N bit digital output, which can comprise one or more digital bits. The digital output is fed back to a negative input of summer 130 through feedback path 134.

Figure 3A:
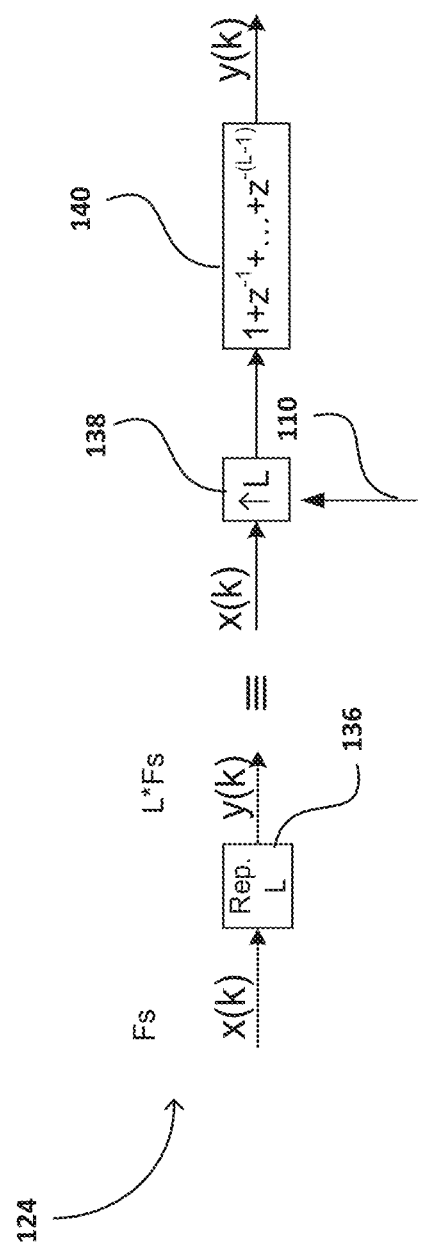
FIG. 3A shows a repeater for the embodiment of FIG. 1A, according to an embodiment.

FIG. 3A shows an example of repeater 124 for the digital microphone embodiment of FIG. 1A. When the repeater function is desired, for example, in the low power mode operating mode, additional zeroes are added to the transfer function of the repeater, so that, in the case of the example of FIG. 1A, the original sampling rate of the digital output signal can be restored. Thus, the left-hand portion of FIG. 3A shows a repeater having an "L" transfer function 136 for converting an input sample frequency $f_s$ (and in the frequency domain the input function is written x(k)) and an output sample frequency of $L*f_s$ (and in the frequency domain the output function is written y(k)), wherein L can be an integer greater than one. The right-hand portion of FIG. 3A breaks the L transfer function 136 into two components, an "L" component coupled to the control input 110 for specifying the number of extra zeroes required, and an averaging filter 140, having the transfer function of $1+z^{-1}+ \ldots +z^{(L-1)}$.

FIG. 3A thus shows an equivalency. The left hand portion of FIG. 3A shows that the input signal on a low sampling rate is repeated (on the high sampling rate, the sampling rate is increased by a factor of "L" from low sampling rate). The right hand side shows the same signals obtained with a standard interpolation approach. In block 138 zeros are inserted (two zeros if L=3) followed by an averaging filter 140.

Figure 3B:
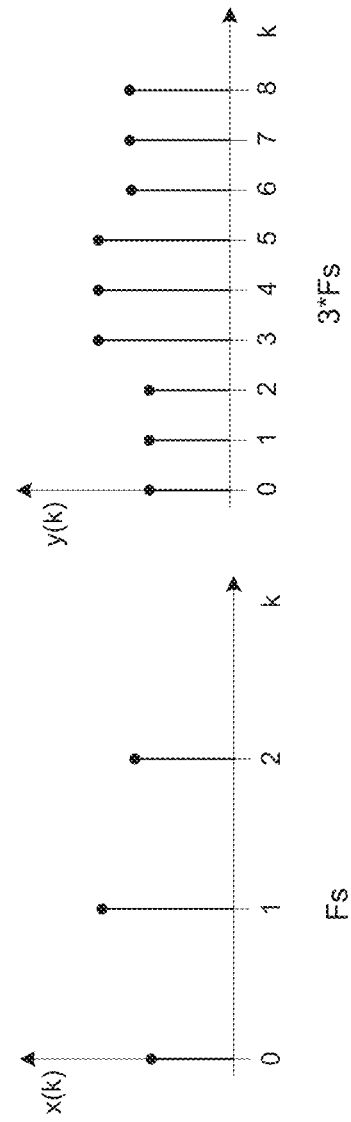
FIG. 3B shows a corresponding diagram for the input and output functions with respect to frequency of the repeater of FIG. 3A.

A corresponding time domain plot is shown in FIG. 3B. The left-hand portion of FIG. 3B corresponds to the input function x(k) versus the sample frequency $f_s$, and the right-hand portion of FIG. 3B corresponds to the output function y(k) versus the sample frequency $L*f_s$, wherein L=3 (each frequency sample is repeated 3 times). Numerous software and hardware digital implementations are possible for the repeater 124 shown in FIGS. 3A and 3B, and for other similar implementations such as frequency converters and frequency multipliers.

Figure 4:
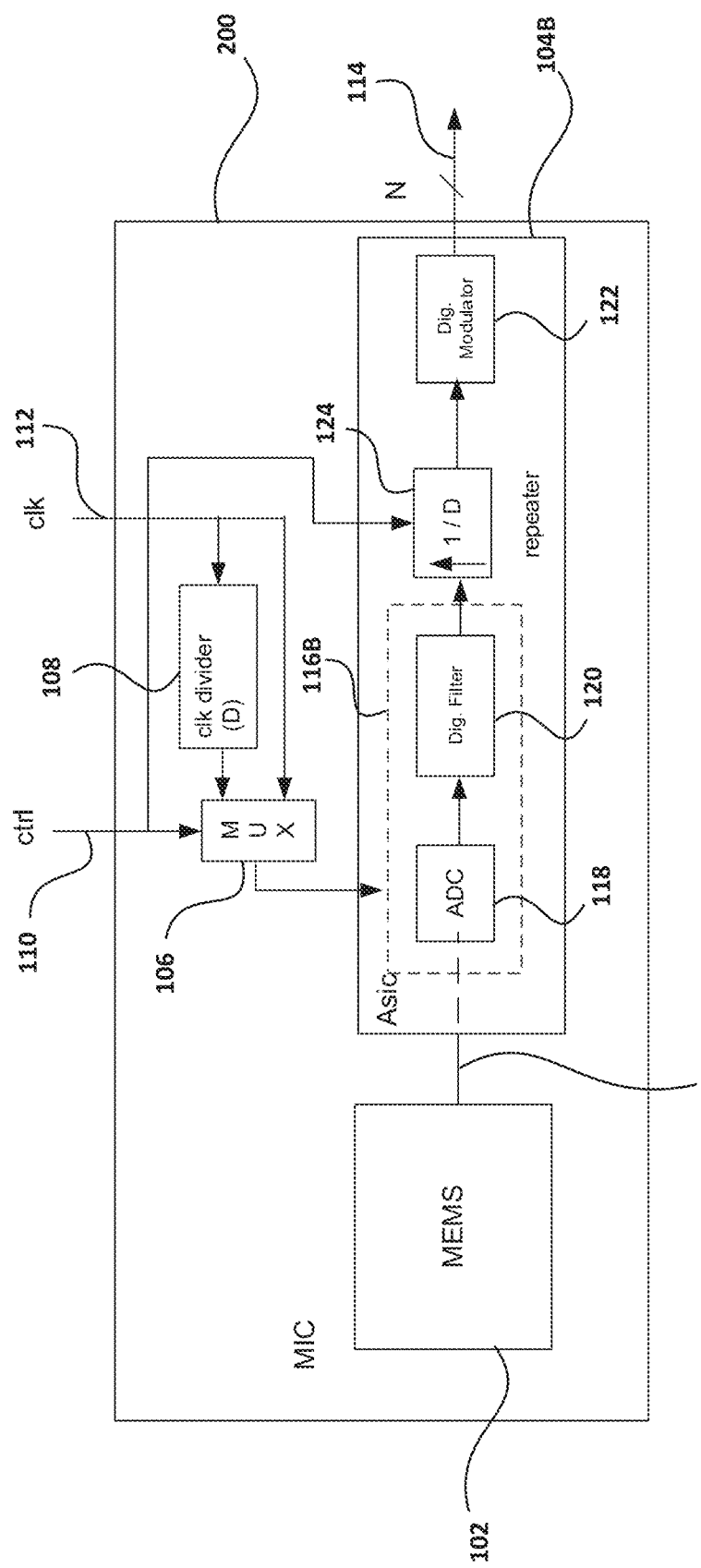
FIG. 4 shows another embodiment of a digital microphone with internal clock changing, wherein the digital modulator clock rate is constant.

FIG. 4 shows another embodiment of a digital microphone 200 with internal clock changing, wherein the digital modulator 122 clock rate is constant by placing the digital modulator outside of the digital signal processing circuitry 116B, but inside of ASIC 104B. All other blocks in the digital microphone 200 of FIG. 4 are substantially the same as those previously described and shown in FIG. 1A.

For optimizing potential residual switching transients, the interpolation stage (repeater 124) can be shifted after the digital filter 120 so that also the digital modulator 122 is always running at a constant rate independent of the clock signal of ADC 118 and digital filter 120 as is shown in FIG. 4. Note that the clock signal for ADC 118 and digital filter 120 is provided by the output of multiplexer 106. Thus, the clock signal is switched between two different values the high performance mode and the low power mode. However, the clock signal for digital modulator 122 is provided directly by the undivided clk signal from clock input 112.

Figure 5:
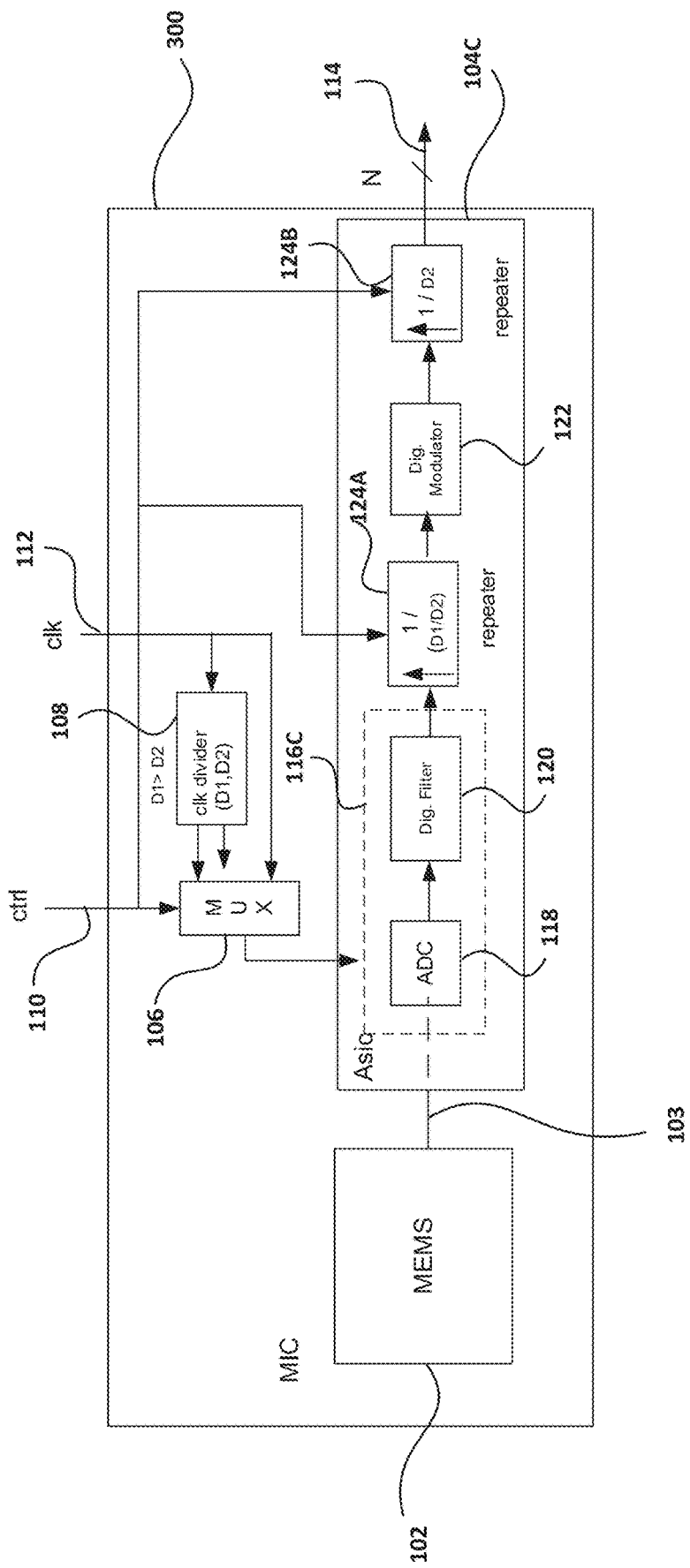
FIG. 5 shows another embodiment of a digital microphone having multiple repeaters.

FIG. 5 shows another embodiment of a digital microphone 300 having multiple repeaters 124A and 124B. Clock divider 108 is set to divide the input clock frequency by a factor of D1. In an example D1=4, and D2=2, while the clock rate at the interface is maintained. In this example the ADC 118 is clocked D1-times lower (4) and the interpolation (upsampling) is done in two steps. The first repeater 124A is upsampling by D1/D2 (by a factor of two) and the second repeater 124B is upsampling by a factor of D2 (also by a factor of two in this example).

All other blocks in the digital microphone 300 of FIG. 5 are substantially the same as those previously described and shown in FIG. 4. In the embodiment of FIG. 5 the interpolation of the digital output signal at digital output 114 is done in two steps. For example, if D1 is set to four and D2 is set to two, a first repeater 124A performs a first interpolation step, wherein an extra zero is inserted, and the output of first repeater 124A doubles the sample rate (D1/D2=4/2=2). The output of first repeater 124A is coupled to the input of digital modulator 122. A second repeater 124B performs a second interpolation steps, wherein an extra zero is also inserted, and the output of second repeater 124B doubles the sample rate (D2=2). Numerous other examples can be constructed, using different values for D1 and D2. Note that repeaters 124A and 124B are controlled directly by the ctrl control signal from control input 110. In a first mode of operation, determined by the state of the ctrl control signal, repeaters 124A and 124B do not add the additional zeroes and the sample rate is the same at the input and output of the repeaters. In a second mode of operation, determined by the state of the ctrl control signal, repeaters 124A and 124B add additional zeroes by a factor of D1/D2, and D2 respectively. The output sample rate is interpolated by these factors and is not equal to the input sample rate at the input of the repeater. The split repeater embodiment of the digital microphone 300 shown in FIG. 5 is used to further minimize switching artefacts between the low power operating mode and the high performance operating mode.

Figure 6:
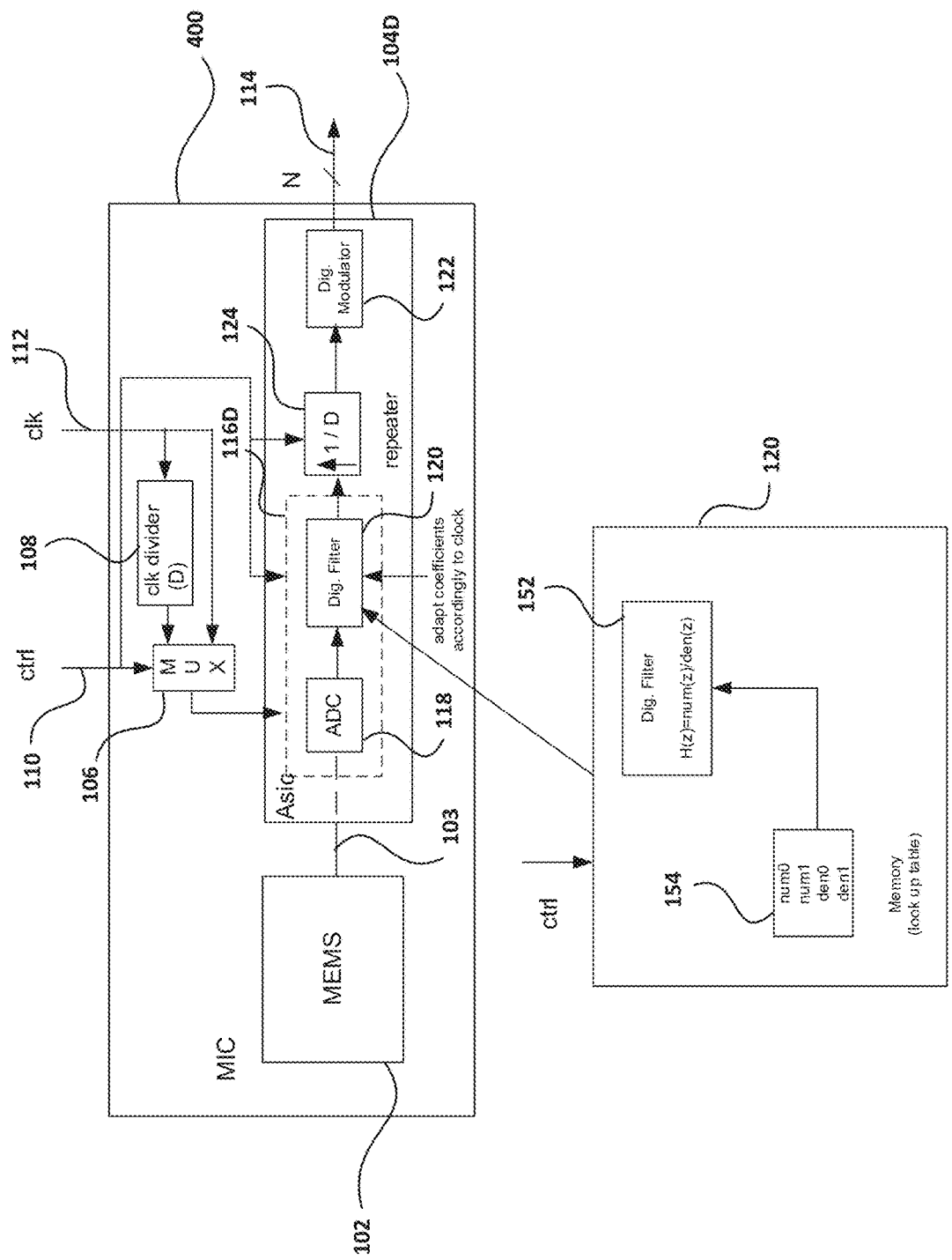
FIG. 6 shows another embodiment of a digital microphone having adaptable filter coefficients.

FIG. 6 shows another embodiment of a digital microphone 400 having adaptable filter coefficients. FIG. 6 is similar to the previous embodiment of digital microphone 200 shown in FIG. 4, but further details of the digital filter 120 are shown to provide the adaptable filter coefficient function. FIG. 6 thus shows an implementation where the digital filter 120 coefficients are adjusted based on the required performance/clock mode to even further improve the switching transient behavior for a seamless transition. All required filters are designed in a configurable manner so that their properties stay constant under changing clock rate conditions.

Digital filter 120 is shown in further detail in FIG. 6 including a filter transfer function 152 defined as H(z)=num(z)/den(z), wherein num(z) is the numerator of the filter transfer function 152, and den(z) is the denominator of the filter transfer function 152. A lookup table or memory 154 includes two different numerators num0 and num1, and two different denominators den0 and den1. Since digital filter 120 is under control of the ctrl control signal, num0 and den0 are used in the transfer function in a first mode of operation determined by a first state of the ctrl control signal, and num1 and den1 are used in the transfer function in a second mode of operation determined by a second state of the ctrl control signal.

Figure 7A:
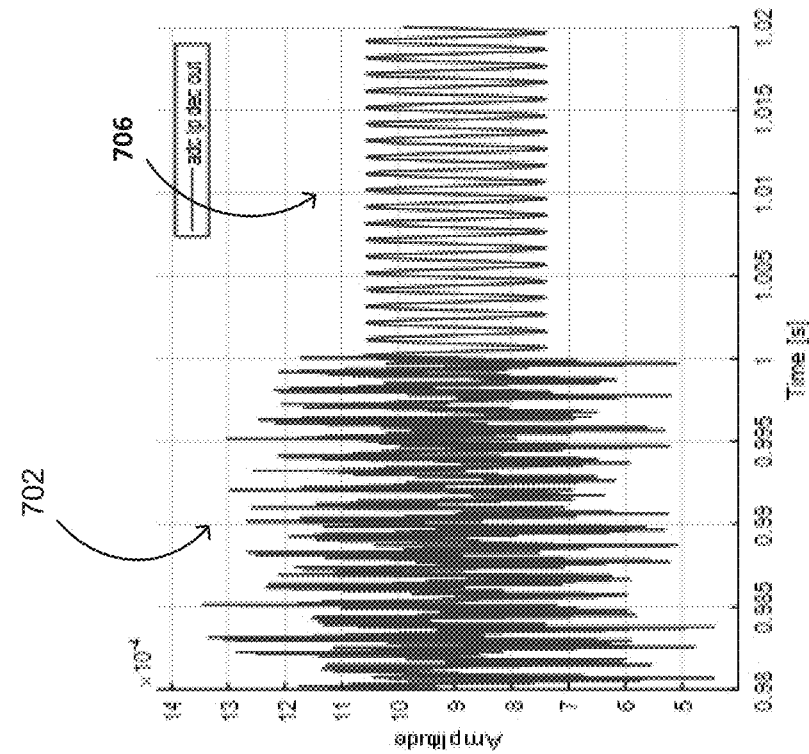
FIG. 7A shows a simulated timing diagram associated with a digital microphone including a restart delay period.
Figure 7B:
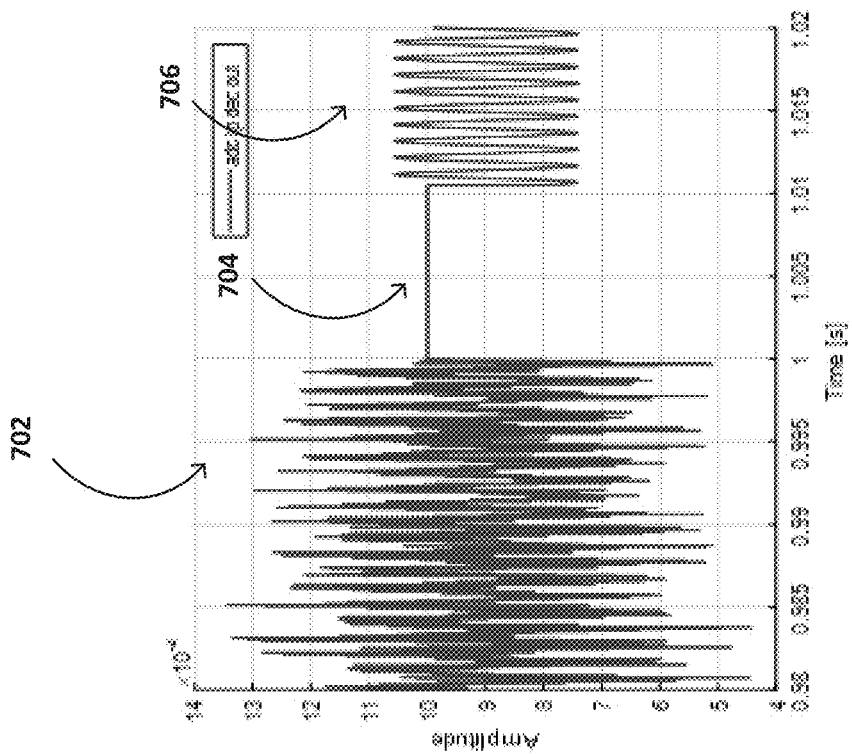
FIG. 7B shows a simulated timing diagram associated with any of the digital microphone embodiments shown in FIG. 1, 4, 5, or 6.

FIG. 7A shows a simulated timing diagram of a digital microphone embodiment including a restart delay and 7B shows a simulated timing diagram associated with any of the digital microphone embodiments shown in FIG. 1, 4, 5, or 6. Simulations show that is possible to enable seamless audio switching and reduce audible switching effects as well as transients that are potentially harmful for the following signal chain to a minimum. The transient signal comparison of an embodiment having a restart delay is depicted in FIG. 7A, and an embodiment as shown in FIG. 1, 4, 5, or 6 is shown in FIG. 7B. The digital microphone output signal changes from the low power mode to the high performance mode.

FIG. 7A thus shows a low power mode output signal 702 followed by a restart delay 704, which is followed by a high performance mode output signal 706. FIG. 7B thus shows the low power mode output signal 702 directly followed by the high performance mode output signal 706. The transition between the two modes is accomplished with a seamless transition and a minimization of switching transients. The output signals of FIGS. 7A and 7B are obtained at output node 114.

Example embodiments of the present invention are summarized here. Other embodiments can also be understood from the entirety of the specification and the claims filed herein.

Example 1. According to an embodiment, a method of operating a microelectromechanical system (MEMS) includes, in a first operational mode, converting an analog output of the MEMS into a first internal data stream and a first external data stream having a first sampling rate; transitioning from the first operational mode to a second operation mode without restarting the MEMS; and in the second operational mode, converting the analog output of the MEMS into a second internal data stream having a second sampling rate different from the first sampling rate, and performing a sampling rate conversion of the second internal data stream to generate a second external data stream.

Example 2. The method of Example 1, wherein the first external data stream and the second external data stream are provided at a one or more output nodes.

Example 3. The method of any of the previous examples, wherein a sampling rate of the first external data stream and a sampling rate of the second external data stream are equal.

Example 4. The method of any of the previous examples, wherein performing a sampling rate conversion of the second internal data stream to generate a second external data stream comprises repeating samples in the second internal data stream.

Example 5. The method of any of the previous examples, wherein converting the analog output of the MEMS comprises performing a sigma-delta analog-to-digital conversion on the analog output of the MEMS.

Example 6. The method of any of the previous examples, wherein converting the analog output of the MEMS into the first internal data stream is performed by a signal processing circuit clocked at the first sampling rate, and wherein converting the analog output of the MEMS into the second internal data stream is performed by the signal processing circuit clocked at the second sampling rate.

Example 7. The method of any of the previous examples, wherein the signal processing circuit comprises an analog-to-digital converter (ADC) and a digital filter.

Example 8. The method of any of the previous examples, further comprising providing a first set of coefficients to the digital filter in the first operational mode and providing a second set of coefficients to the digital filter in the second operational mode.

Example 9. The method of any of the previous examples, wherein the signal processing circuit further comprises a digital modulator.

Example 10. The method of any of the previous examples, wherein the signal processing circuit receives an undivided clock signal in the first operational mode and a divided clock signal in the second operational mode.

Example 11. The method of any of the previous examples, wherein the MEMS comprises a microphone.

Example 12. According to an embodiment, a circuit includes a clock divider having an input coupled to a clock signal input; a multiplexer having a first input coupled to an output of the clock divider, a second input coupled to the clock signal input, a third input coupled to a control signal input, and an output, wherein the multiplexer couples the first input to the output or couples the second input to the output according to a state of the control signal input; a signal processing circuit having an analog signal input, a clock signal input coupled to the output of the multiplexer, and a digital signal output comprising one or more output nodes; and a frequency converter coupled between the digital signal output of the signal processing circuit and a data stream output, wherein a conversion factor of the frequency converter is determined according to the state of the control signal input.

Example 13. The circuit of Example 12, wherein the signal processing circuit includes an analog-to-digital converter (ADC) having an input coupled to the analog signal input; a digital filter having an input coupled to an output of the ADC; and a digital modulator having an input coupled to an output of the digital filter and an output coupled to the digital signal output.

Example 14. The circuit of any of the previous examples, wherein the signal processing circuit comprises: an analog-to-digital converter (ADC) having an input coupled to the analog signal input; and a digital filter having an input coupled to an output of the ADC and an output coupled to the digital signal output.

Example 15. The circuit of any of the previous examples, further comprising a digital modulator interposed between the frequency converter and the data stream output.

Example 16. The circuit of any of the previous examples, further comprising an additional frequency converter interposed between the digital modulator and the data stream output.

Example 17. The circuit of any of the previous examples, wherein the digital filter comprises an additional input for receiving a first set of coefficients or a second set of coefficients according to the state of the control signal input.

Example 18. The circuit of any of the previous examples, further comprising a microelectromechanical system (MEMS) having an output coupled to the analog signal input of the signal processing circuit.

Example 19. The circuit of any of the previous examples, wherein the MEMS comprises a microphone.

Example 20. According to an embodiment, a microelectromechanical (MEMS) circuit in a single package includes a control signal input, a clock signal input, and a data stream output for providing a constant rate single bit output stream at one or more output nodes; a MEMS device; and a signal processing circuit coupled to the MEMS device, to the control signal input, to the clock signal input, and the data stream output, wherein, in a first mode of operation determined by a first state of the control signal input, at least a portion of the signal processing circuit is directly coupled to the clock signal input, and wherein, in a second mode of operation determined by a second state of the control signal input, the at least a portion of the signal processing circuit is coupled to the clock signal input through a clock divider.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a digital device, the method comprising:
   in a first operational mode, converting an analog output of a microelectromechanical system (MEMS) into a first internal data stream having a first sampling rate derived from a clock frequency of an undivided clock signal and a first external data stream having the first sampling rate;
   transitioning from the first operational mode to a second operational mode without restarting the MEMS;
   in the second operational mode, converting the analog output of the MEMS into a second internal data stream having a second sampling rate different from the first sampling rate, and performing a sampling rate conversion of the second internal data stream to generate a second external data stream having the first sampling rate, wherein the second sampling rate is derived from a clock frequency of a divided clock signal;
   inputting the undivided clock signal into a first input of a multiplexer;
   inputting the undivided clock signal into a clock divider to generate the divided clock signal;
   inputting the divided clock signal into a second input of the multiplexer; and
   inputting a control signal to a control input of the multiplexer, the control signal indicating one of the first and second operational modes,
   wherein, in the first operational mode, the multiplexer couples the first input of the multiplexer to an output of the multiplexer, wherein, in the second operational mode, the multiplexer couples the second input of the multiplexer to the output of the multiplexer, and wherein the output of the multiplexer provides the undivided clock signal in the first operational mode and provides the divided clock signal in the second operational mode.

2. The method of claim 1, wherein the first external data stream and the second external data stream are provided at one or more output nodes.

3. The method of claim 1, wherein performing a sampling rate conversion of the second internal data stream to generate a second external data stream comprises repeating samples in the second internal data stream.

4. The method of claim 1, wherein converting the analog output of the MEMS comprises performing a sigma-delta analog-to-digital conversion on the analog output of the MEMS.

5. The method of claim 1, wherein converting the analog output of the MEMS into the first internal data stream is performed by a signal processing circuit clocked at the first sampling rate, and wherein converting the analog output of the MEMS into the second internal data stream is performed by the signal processing circuit clocked at the second sampling rate.

6. The method of claim 5, wherein the signal processing circuit comprises an analog-to-digital converter (ADC) and a digital filter.

7. The method of claim 6, further comprising providing a first set of coefficients to the digital filter in the first operational mode and providing a second set of coefficients to the digital filter in the second operational mode.

8. The method of claim 6, wherein the signal processing circuit further comprises a digital modulator.

9. The method of claim 1, wherein the MEMS comprises a microphone.

10. A circuit comprising:
    a clock divider having an input coupled to a clock signal input;
    a multiplexer having a first input coupled to an output of the clock divider, a second input coupled to the clock signal input, a third input coupled to a control signal input, and an output, wherein the multiplexer is configured to couple either of the first input and the second input to the output of the multiplexer according to a state of the control signal input;
    a signal processing circuit having an analog signal input, a clock input coupled to the output of the multiplexer, and a digital signal output comprising one or more output nodes; and
    a frequency converter coupled between the digital signal output of the signal processing circuit and a data stream output, wherein a conversion factor of the frequency converter is determined according to the state of the control signal input,
    wherein the signal processing circuit is configured to:
      in a first operational mode, convert an analog output of a microelectromechanical system (MEMS) into a first internal data stream having a first sampling rate derived from a clock frequency of an undivided clock signal and a first external data stream having the first sampling rate;

transition from the first operational mode to a second operational mode without restarting the MEMS;

in the second operational mode, convert the analog output of the MEMS into a second internal data stream having a second sampling rate different from the first sampling rate, and perform a sampling rate conversion of the second internal data stream to generate a second external data stream having the first sampling rate, wherein the second sampling rate is derived from a clock frequency of a divided clock signal;

input the undivided clock signal into the first input of the multiplexer;

input the undivided clock signal into the clock divider to generate the divided clock signal;

input the divided clock signal into the second input of the multiplexer; and input a control signal to a control input of the multiplexer, the control signal indicating one of the first and second operational modes, wherein, in the first operational mode, the multiplexer couples the first input of the multiplexer to the output of the multiplexer, wherein, in the second operational mode, the multiplexer couples the second input of the multiplexer to the output of the multiplexer, and wherein the output of the multiplexer provides the undivided clock signal in the first operational mode and provides the divided clock signal in the second operational mode.

11. The circuit of claim 10, wherein the first external data stream and the second external data stream are provided at one or more output nodes.

12. The circuit of claim 10, wherein performing a sampling rate conversion of the second internal data stream to generate a second external data stream comprises repeating samples in the second internal data stream.

13. The circuit of claim 10, wherein converting the analog output of the MEMS comprises performing a sigma-delta analog-to-digital conversion on the analog output of the MEMS.

14. The circuit of claim 10, wherein converting the analog output of the MEMS into the first internal data stream is performed by the signal processing circuit clocked at the first sampling rate, and wherein converting the analog output of the MEMS into the second internal data stream is performed by the signal processing circuit clocked at the second sampling rate.

15. The circuit of claim 14, wherein the signal processing circuit comprises an analog-to-digital converter (ADC) and a digital filter.

16. The circuit of claim 15, wherein the signal processing circuit further comprises a digital modulator.

17. The circuit of claim 10, wherein the MEMS comprises a microphone.

18. A microelectromechanical (MEMS) circuit in a single package comprising:

a control signal input, a clock signal input, and a data stream output for providing a constant rate single bit output stream at one or more output nodes;

a MEMS device; and a signal processing circuit coupled to the MEMS device, to the control signal input, to the clock signal input, and the data stream output, wherein the signal processing circuit is configured to:

in a first operational mode, convert an analog output of the MEMS device into a first internal data stream having a first sampling rate derived from a clock frequency of an undivided clock signal and a first external data stream having the first sampling rate;

transition from the first operational mode to a second operational mode without restarting the MEMS; and in the second operational mode, convert the analog output of the MEMS device into a second internal data stream having a second sampling rate different from the first sampling rate, and perform a sampling rate conversion of the second internal data stream to generate a second external data stream having the first sampling rate, wherein the second sampling rate is derived from a clock frequency of a divided clock signal.

19. The microelectromechanical (MEMS) circuit of claim 18, wherein converting the analog output of the MEMS device into the first internal data stream is performed by the signal processing circuit clocked at the first sampling rate, and wherein converting the analog output of the MEMS into the second internal data stream is performed by the signal processing circuit clocked at the second sampling rate.

20. The microelectromechanical (MEMS) circuit of claim 18, wherein the MEMS device comprises a microphone.

* * * * *